United States Patent [19]
Liu et al.

[11] Patent Number: 5,739,063
[45] Date of Patent: Apr. 14, 1998

[54] HIGH TEMPERATURE LOCAL OXIDATION OF SILICON FOR FINE LINE PATTERNS

[75] Inventors: Yowjuang W. Liu; Yu Sun, both of San Jose, Calif.

[73] Assignee: Advanced Micro Devices, Inc., Sunnyvale, Calif.

[21] Appl. No.: 483,559

[22] Filed: Jun. 7, 1995

[51] Int. Cl.$^6$ .................................................. H01L 21/76
[52] U.S. Cl. .......................................... 438/452; 438/765
[58] Field of Search ............................. 437/69, 70, 239; 148/DIG. 117; 438/452, 765

[56] References Cited

U.S. PATENT DOCUMENTS 4,551,910  11/1985  Patterson .
5,151,381   9/1992  Liu et al. .

OTHER PUBLICATIONS

Wolf, S., et al., *Silicon Processing for the VLSI Era: vol. 1, Process Technology*, Lattice Press, 1986, pp. 215–216.

Ghandhi, S., *VLSI Fabrication Principles*, 1983, Wiley Interscience Paslication, pp. 388–391.

Subrahmanyan, R., et al, "The Influence of HCl . . . in Silicon", J. Appl. Phys., 61(10), 15 May 1987, pp. 4804–4807.

*Primary Examiner*—George R. Fourson

[57] ABSTRACT

Field oxide regions are formed in a dry oxygen environment containing controlled amounts of HCl at elevated temperatures to reduce edge defects of narrow source/drain regions.

59 Claims, 2 Drawing Sheets

HIGH TEMPERATURE LOCAL OXIDATION OF SILICON FOR FINE LINE PATTERNS

TECHNICAL FIELD

The present invention relates to a method for forming the field oxide region on a semiconductor surface by local oxidation of silicon (LOCOS). The invention has particular applicability for high density semiconductor devices.

BACKGROUND ART

In the manufacture of various types of semiconductor devices, individual circuit components are formed in a semiconductor substrate and electrically isolated from each other. Conventional practices comprise forming field oxide regions to effect such isolation. Bird's beaks, which are caused by the lateral growth of the oxide during the field oxidation process, serve as stress buffers or relief transition regions alleviating damage to the substrate due to generated stresses. However, bird's beaks occupy a significant amount of real estate on a semiconductor substrate or circuit space, which is antithetic to the increasing demands for densification and miniaturization. Stress induces defects such as dislocation defects and stacking faults.

Conventional LOCOS techniques comprise forming a pad or barrier oxide layer on the surface of a semiconductor substrate, forming a nitride layer overlying the pad or barrier oxide layer, and conducting conventional photolithographic and etching techniques to pattern the nitride layer. The exposed portions of the substrate are then oxidized. As a result of such conventional LOCOS techniques, bird's beaks are formed by lateral oxidation under portions of the nitride layer, thereby reducing the size of the active region making it extremely difficult to increase densification and miniaturization.

Although bird's beaks are undesirable from a miniaturization point of view, they provide stress relief transition regions which prevent damage to the substrate during field oxide formation. A higher thickness ratio of the nitride layer to the oxide layer improves the resulting structure of the field oxide regions by reducing bird's beak formation. However, since stress increases exponentially with increased nitride thickness, there is a practical limit on the thickness of the nitride layer and, hence, the ratio of nitride to oxide thickness in conventional LOCOS processes. Moreover, the length of the bird's beak formed during conventional LOCOS processes is not linearly shrinkable with field oxide thickness, because the ratio of the bird's beak length to the field oxide thickness increases as the field oxide thickness is reduced. Another limitation of conventional LOCOS processes is the narrow spacing effect, i.e., the as grown field oxide thickness decreases with the spacing between active regions. As a result, the field isolation becomes less effective as the distance between the active regions becomes smaller. Accordingly, it becomes extremely difficult to scale down the bird's beak size in high density applications.

A solution to the bird's beak problem attendant upon conventional LOCOS processes is disclosed in U.S. Pat. No. 5,151,381 (the '381 Patent), which is hereby incorporated herein by reference in its entirety. The solution to the bird's beak problem disclosed in the '381 Patent comprises a two stage oxidation process of the semiconductor substrate in a dry oxygen environment at a temperature no less than 1000° C. Hydrogen chloride (HCl) is added to the oxidation environment to reduce or eliminate stacking faults, particularly at the interface between the barrier oxide layer and the silicon substrate. The higher temperature of the field oxidation reduces physical stresses because the reduced viscosity of the field oxide being formed permits the oxide to flow. This reduction in physical stress permits a higher nitride to oxide layer thickness ratio, e.g., about 10 or greater. The narrow spacing effect of the conventional LOCOS processes is also alleviated. Another disclosed benefit of the high temperature oxidation process is the ability to simultaneously oxidize and drive the impurities into the substrate.

Thus, the two stage high temperature oxidation process disclosed in the '381 Patent achieves superior results over conventional LOCOS processes by, inter alia, reducing the bird's beak, reducing stress and reducing stacking faults particularly at the interface between the barrier oxide layer and the silicon substrate. However, the escalating requirements for densification and miniaturization impose further requirements on LOCOS techniques, particularly for submicron geometry, i.e., below 0.5 microns, most particularly in the formation of narrow source/drain regions.

DISCLOSURE OF THE INVENTION

An object of the present invention is a method of forming a field oxide region for isolating active regions having very small dimensions.

A further object of the present invention is a method for forming field oxide regions which enables the formation of very narrow source/drain regions.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of forming a field oxide region in a semiconductor substrate, which method comprises: forming a barrier oxide layer on the substrate; oxidizing the substrate in a dry oxygen atmosphere containing HCl at a temperature greater than about 1,050° C. in a first high temperature oxidation stage; and subsequently oxidizing the substrate in a dry oxygen atmosphere in the substantial absence of HCl at a temperature greater than about 1,050° C. in a second high temperature oxidation stage to complete the field oxide region.

Another aspect of the present invention is a method of forming a field oxide region in a semiconductor substrate which method comprises: providing a barrier oxide layer on the substrate; oxidizing the substrate in a dry oxygen atmosphere containing HCl at a temperature less than about 1,050° C. in a first oxidation stage; and oxidizing the substrate in a dry oxygen atmosphere in the substantial absence of HCl at a temperature greater than about 1,050° C. in a second oxidation stage.

A further aspect of the present invention is a method of forming a field oxide region in a semiconductor substrate which method comprises: forming a barrier oxide layer on the substrate in an atmosphere containing HCl at a temperature less than about 1,050° C.; and oxidizing the substrate in contact with the barrier oxide layer in a dry oxygen environment at a temperature in excess of about 1,050° C. in a field oxidation stage to form the field oxide region.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
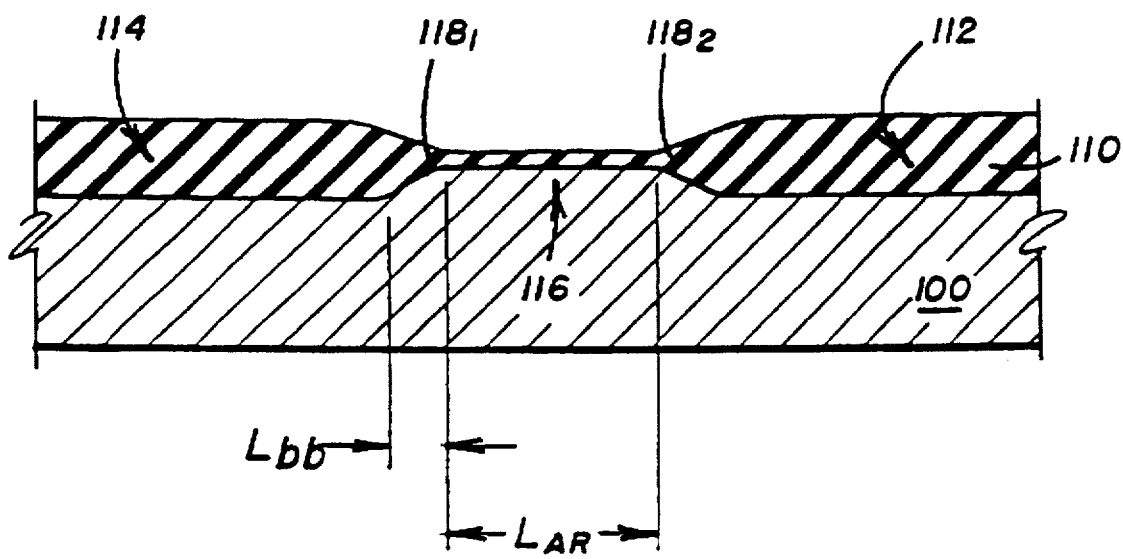
FIG. 1 is a partial sectional view of the substrate having field oxide regions formed by a conventional LOCOS process.
Figure 2:
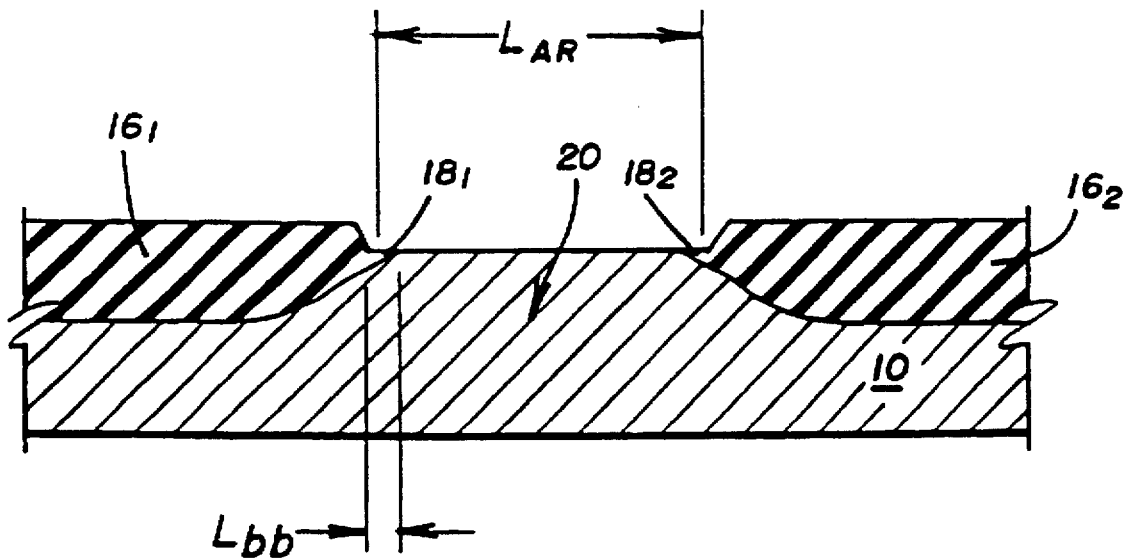
FIG. 2 is a partial sectional view of the substrate having field oxide regions formed in accordance with the method disclosed in the '381 patent.

A comparison of FIGS. 1 and 2 (from the '381 Patent) illustrates the improvement achieved by the high temperature two stage LOCOS process disclosed in the '381 Patent. It should be apparent that the length of the bird's beaks $18_1$ and $18_2$ formed by the method disclosed in the '381 Patent (FIG. 2) is considerably shorter than the length of conventional bird's beaks $118_1$ and $118_2$ in the conventional LOCOS process (FIG. 1). In FIG. 2, the semiconductor substrate designated by the numeral 10 and the isolation field oxide regions by $16_1$ and $16_2$. In FIG. 1, the substrate is designated by the numeral 100 and the field oxide regions by 114 and 112. In both FIGS. $L_{bb}$ represents the length of the bird's beak and $L_{AR}$ is the length of the active region 20 in the FIG. 2 device and 116 in the FIG. 1 device.

Upon extensive experimentation and investigation, it was discovered that the application of the method disclosed in the '381 Patent to fine line patterns, particularly narrow source/drain regions, results in the generation of defects at the tips of such source/drain regions. It was found that the high temperature LOCOS technique of the '381 Patent, when applied to very fine geometries, particularly narrow source/drain regions, causes a reduction in the adhesion of the barrier oxide layer to the semiconductor substrate 10. As a result, upon application of a hot phosphoric acid etch to remove the nitride layer, the underlying semiconductor substrate is damaged at the terminal portions of the barrier oxide, thereby damaging the end portions of the source/drain regions. This damage is characterized as "tip defects."

The method disclosed in the '381 Patent includes HCl in the oxidizing environment for the purpose of preventing stacking faults. As disclosed in the '381 Patent, it is believed that oxygen is injected into the crystalline lattice of the silicon substrate, and that this interstitial oxygen causes mismatches in the lattice which lead to stacking faults. HCl neutralizes the interstitial oxygen, thereby preventing stacking faults.

Figure 3:
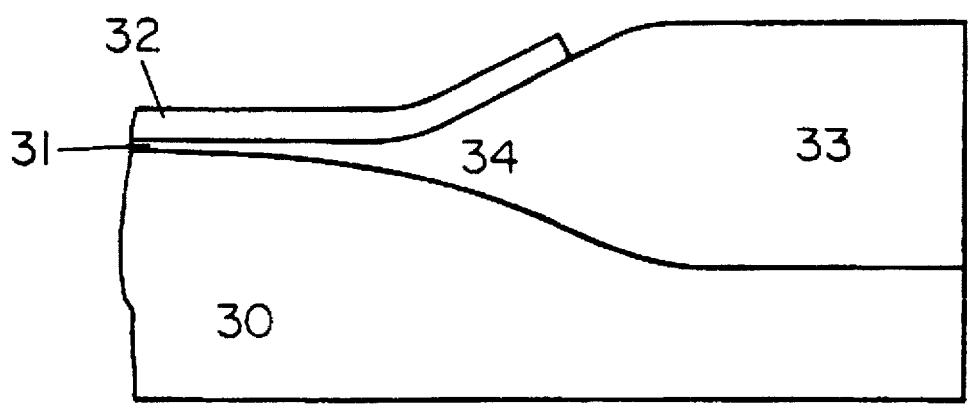
FIG. 3 is a partial sectional view illustrating the stress induced by a bird's beak.

It should be apparent from FIG. 3, that upon forming a field oxide region 33 in semiconductor substrate 30, bird's beak region 34 creates stresses between nitride layer 32 and barrier oxide layer 31. As a result of such stresses, tip defects form at the end of a very narrow source/drain region, i.e., less than 0.6 µm. The formation of such tip defects is believed to be a function of the source/drain width and the field oxide thickness. It would appear that the tip defects are somewhat inversely dependent upon the nitride thickness which is, of course, opposite to the trend predicted by conventional compressive stress models. Tip defects are, therefore, believed to be due to a tensile dominated stress as a result of the nitride being forced by the field oxide grown during the field oxidation. When a thick field oxide is grown with respect to the bird's beak, tensile stresses can surpass the sum of adhesion and compressive stresses at the tip of a narrow source/drain region and cause these tip defects.

While not wishing to be bound to any particular mechanistic theory, it is believed that although chlorine is required at the interface to reduce stacking faults, chlorine remains and accumulates at the interface, thereby, dynamically, physically interfering with the formation of silicon-oxygen bonds at the interface. As previously discussed, as a result of the stress profile generated during formation of a bird's beak, the ends of the barrier oxide film are stressed which alters its etching characteristics at such ends. For example, during the hot phosphoric acid etch to remove the nitride layer, the nitride layer is etched at about 30 Å/min.; whereas, the unstressed oxide layer is etched at about 1 Å/min. However, upon stressing the terminal portions of the oxide, the etch characteristics are dramatically altered so that hot phosphoric acid rapidly etches the underlying silicon substrate. The reduction in adhesion due to the accumulation of chlorine at the interface between the barrier oxide layer and semiconductor substrate exacerbates this condition thereby enhancing the formation of tip defects.

Thus, as a result of extensive experimentation and investigation, a tip defect problem was discovered upon applying the high temperature LOCOS technique of the '381 Patent to fine geometries requiring very narrow source/drain regions, and the source of the tip defect problems traced to the stresses generated during LOCOS and the presence of chlorine at the interface of the barrier oxide layer and the semiconductor substrate. In accordance with the present invention, this problem is solved by controlling the amount of HCl employed during formation of a field oxide region so that the peak concentration of chlorine at the interface between the barrier oxide layer is sufficient to reduce or eliminate stacking faults, but limited to avoid adversely affecting the operation of a semiconductor device with fine line geometry, as by tip defects. Thus, in accordance with the present invention, the amount of HCl during formation of the field oxide region is controlled to limit the peak concentration of chlorine at the interface of the barrier oxide layer to the semiconductor substrate to avoid reduction of the adhesion of the barrier oxide layer to the semiconductor substrate.

The tip defects can be inspected by conventional analytical tools, such as Secondary Electron Microscopy (SEM) and Transmission Electron Microscopy (TEM). The amount of chlorine at the interface between the barrier oxide layer and the semiconductor substrate can be monitored by conventional analytical tools, such as Secondary Ion Microscopy (SIMS). These analytical tools enable detection of the tip defects and the concentration profile of chlorine atoms at the interface between the barrier oxide layer and the semiconductor substrate. In this way, the amount of chlorine at the interface between the barrier oxide layer and the semiconductor substrate can be correlated to the tip defects. In addition, quality of the gate oxide layer can be monitored by conventional QBD measurements to determine the time to breakdown employing conventional apparatus, such as an HP4145 available from Hewlett Packard. In this way, the amount of chlorine at the interface between the barrier oxide layer and the semiconductor substrate can be correlated to the quality of the gate oxide and, thereby, the amount of HCl can be related to the breakdown of the gate oxide layer. The amount of HCl employed to achieve the desired objectives is inversely proportionate to the temperature that which the HCl is introduced. Thus, as the temperature of the stage in which HCl is employed increases, the amount of HCl in the atmosphere decreases. One having ordinary skill in the art optimizes the relative amount of HCl and temperature for a particular situation. The gate oxide layer is part of the original barrier oxide layer on which the nitride layer is formed.

After further investigation, it was determined that, desirably, the amount of HCl be limited during high temperature field oxide formation, as in the '381 Patent, to less than 0.1%. However, it was also found that it is extremely difficult to maintain the concentration of the HCl during high temperature field oxide formation to less than 0.1% for fine line patterns. Accordingly, further experimentation and investigation were conducted, during which it was discovered that the stress peak occurs during the latter portion of growth of the field oxide region. Accordingly, the present invention comprises limiting the amount of HCl during the latter portion of the growth of the field oxide region where such greater stress is generated.

In one embodiment of the present invention, the field oxidation technique disclosed in the '381 Patent is modified by conducting the high temperature oxidation in two stages. In the first high temperature oxidation stage above about 1,050° C., HCl is added to the dry oxygen oxidizing atmosphere. The second subsequent high temperature dry oxygen oxidation stage is conducted in a dry oxygen atmosphere in the substantial absence of HCl, preferably the complete absence of HCl. The first high temperature oxidation stage is preferably conducted until the thickness of the field oxide region is equal to or less than about 75% of the final thickness, e.g., until it is equal to or less than about 50% of the final thickness, including less than about 25% of the final thickness thereof.

The amount of HCl present during the first high temperature oxidation stage is controlled to prevent stacking faults, as discussed in the '381 Patent. In addition, the amount of HCl is controlled to prevent a substantial reduction in the adhesion of the barrier oxide layer to the semiconductor substrate. The optimum amount of HCl for a particular situation can be determined by one having ordinary skill in the art employing routine experimentation and analytical tools such as SIMS. Thus, the amount of HCl in the first high temperature oxidation stage atmosphere is limited to prevent the generation of tip defects.

As previously disclosed, upon formation of a field oxide region, stresses are generated which operate against adhesion. Upon etching, the nitride with hot phosphoric acid and the stressed ends of the barrier oxide layer etch rapidly. The decrease in adhesion coupled with consequential hot phosphoric acid etching of the substrate contribute to the generation tip defects at narrow source/drain regions. One having ordinary skill in the art could easily relate the amount of HCl during field oxide formation to the creation of tip defects by etching through the barrier oxide layer in optimizing the amount of HCl in a particular situation. The amount of HCl can also be optimized in relation to the peak concentration of chlorine at the interface between the barrier oxide and the silicon substrate to the amount of HCl. For example, it has been found desirable to control the amount of HCl during formation of the field oxide region so that the peak concentration of chlorine at the interface between the barrier oxide layer and the silicon substrate is no greater than $1 \times 10^{19}$ atoms/cm$^3$ at the completion of the field oxide region, preferably employing SIMS. It is to be understood that as the geometry of a pattern decreases, e.g., the source/drain regions become narrower, the peak concentration of chlorine at the interface should be further limited.

It has also been found desirable to control the amount of HCl during field oxide formation with respect to the oxygen concentration at the interface between the barrier oxide layer and the semiconductor substrate. In order to ensure adequate formation of silicon-oxygen bonds and, hence, adequate adhesion of the barrier oxide layer to the semiconductor substrate, the amount of HCl should be controlled to limit the peak concentration of chlorine at the interface between the barrier oxide layer and the silicon substrate no greater than the oxygen concentration at that interface.

The amount of HCl, of course, should be sufficient to maintain the peak concentration of the chlorine at the interface of the barrier oxide layer and the semiconductor substrate so that the stacking faults can be eliminated. The precise peak concentration depends upon a particular situation. However, it has been found that the amount of HCl during formation of the field oxide regions should be controlled to maintain the peak concentration of chlorine at the interface between the barrier oxide layer and the semiconductor substrate at no less than about $10^{16}$ atoms/cm$^3$ at the completion of the field oxide region.

The temperature employed during the first and second high temperature oxidation stages is generally not less than 1,100° C., preferably between about 1,100° C. and about 1,250° C. In accordance with conventional practices, the present invention comprises the use of silicon substrates and field oxide regions comprising silicon dioxide, and encompasses the formation of a plurality of active regions separated by field oxide regions.

In a further aspect of this embodiment, the substrate is oxidized in dry oxygen at a temperature less than about 1,050° C. prior to the first high temperature oxidation stage. The present invention also contemplates various aspects of semiconductor manufacturing disclosed in the '381 Patent, such as a field implantation after the second high temperature oxidation stage. Moreover, since the present invention involves a high temperature oxidation stage, a dopant can be implanted having a conductivity type opposite to the conductivity type of the substrate in a portion of the substrate, prior to oxidizing at a temperature less than about 1,050° C., wherein, the subsequent oxidations below and above 1,050° C. simultaneously oxidize the substrate and drive the implanted dopant into the substrate.

A further modification of this embodiment comprises oxidizing the substrate at a temperature below about 1,050° C. in a dry oxygen atmosphere containing HCl, prior to the first stage oxidation. Desirably, a higher amount of HCl should be used at lower temperatures and prior to the final stages of formation of the field oxide regions.

As in the method disclosed in the '381 Patent, the present invention comprises forming a non-oxidizable masking layer overlying portions of the barrier oxide layer corresponding to active regions, prior to the first high temperature oxidation stage. If a preliminary oxidation is conducted below about 1,050° C., the non-oxidizable masking layer is formed prior to that lower temperature oxidation. The non-oxidizable masking layer is preferably silicon nitride.

Thus, in accordance with the present invention, the amount of HCl employed during LOCOS to minimize stacking faults is controlled to prevent formation of tip defects resulting from an unfavorable stress profile occurring during the latter stages of formation of the field oxide region and a reduction in adhesion of the barrier oxide layer to the semiconductor substrate by virtue of the presence of chlorine at the interface between the barrier oxide layer and the semiconductor substrate. The amount of chlorine at the interface can be monitored with conventional analytical tools, such as SIMS, and the amount of HCl employed in the oxidizing atmosphere adjusted accordingly.

In accordance with a second embodiment of the present invention, a barrier oxide layer is initially formed on a semiconductor substrate, and a first oxidation stage is conducted at a temperature less than about 1,050° C. in a dry oxygen atmosphere containing HCl. The substrate is subsequently oxidized in a dry oxygen atmosphere in the substantial absence of HCl, preferably in the complete absence of HCl, at a temperature greater than about 1,050° C. in a second oxidation stage. As in the first embodiment, the amount of HCl employed during the first oxidation stage is optimized to prevent stacking faults, but controlled to prevent a substantial reduction of the adhesion of the barrier oxide layer to the semiconductor substrate and deterioration of the barrier oxide layer during the subsequent thermal processing. The amount of HCl employed during the first stage oxidation can be optimized in a particular situation by routine experimentation, preferably employing SIMS. It has been found advantageous to maintain the HCl content during the first stage of oxidation at no less than about 0.1%. As in the first embodiment, the amount of HCl during the first oxidation stage is controlled to limit the peak concentration of chlorine at the interface between the barrier oxide layer and the silicon substrate to less than about $10^{19}$ atoms/cm$^3$, and no less than about $1 \times 10^{16}$ atoms/cm$^3$, at the completion of the field oxide region. The amount of HCl during the first oxidation stage can also be controlled to limit the peak concentration of chlorine at the interface between the barrier oxide film and the silicon substrate to less than the oxygen concentration at that interface, as in the previously discussed embodiment.

The second oxidation stage is generally conducted at a temperature no less than 1,100° C., preferably at a temperature of about 1,100° C. to about 1,250° C. As in the first embodiment, a non-oxidizable masking layer can be formed over portions of the barrier oxide corresponding to active regions, preferably of silicon nitride. This embodiment also comprises implanting a dopant having a conductivity type opposite a conductivity type of a substrate in a portion of the substrate, prior to the first oxidation stage, wherein the subsequent first and second oxidation stages simultaneous oxidize the silicon substrate and drive the implanted dopant into the substrate. In accordance with this embodiment, a plurality of field oxide transistors can also be formed in the semiconductor substrate isolated by a plurality of field oxide regions.

Upon further experimentation and investigation, it was found that sufficient chlorine can be introduced to prevent stacking faults by employing HCl during the initial oxidization when forming a barrier oxide layer. Accordingly, in accordance with a third embodiment of the present invention, a field oxide region is formed by initially forming a barrier oxide layer on the substrate in an atmosphere containing HCl at a temperature less than about 1,050° C., and subsequently oxidizing the substrate, in contact with the barrier oxide layer, in a dry oxygen environment at a temperature in excess of 1,050° C. in a field oxidation stage to form the field oxide region. Preferably, the field oxidation stage is conducted in the substantial absence of HCl, most preferably in the complete absence of HCl. As previously disclosed, it was found that most of the stresses occur during latter stages in the formation of the field oxide layer. In accordance with this embodiment, the field oxidation stage is generally conducted at a temperature no less than 1,100° C. preferably at a temperature of 1,100° C. to about 1,250° C.

As in the previous embodiments, a non-oxidizable masking layer can be employed overlying portions of the barrier oxide layer corresponding to the active regions, preferably of silicon nitride. As also in the previously disclosed embodiments, the amount of HCl during the first oxidation stage is sufficient to prevent stacking faults and controlled and prevent substantial reduction in the adhesion of the barrier oxide layer to the semiconductor substrate. As in the previous embodiments, the amount of HCl employed during formation of the barrier oxide layer is optimized in a particular situation to achieve the stated objectives. It has been found advantageous to control the amount of HCl employed during formation of the barrier oxide layer so that the peak concentration of chlorine at the interface between the barrier oxide layer and the silicon substrate is less than about $10^{19}$ atoms/cm$^3$ and preferably no less than about $10^{16}$ atoms/cm$^3$, at the completion of the field oxide region. The amount of HCl can also be controlled to limit the peak concentration of chlorine atoms at the interface between the barrier oxide layer and the semiconductor substrate to less than the amount of oxygen at the interface. As in the other embodiments, a field implantation can be performed after the field stage oxidization.

In another aspect of this embodiment, as in the other embodiments, a dopant is implanted having a conductivity type opposite to the conductivity type of the substrate in a portion of the substrate, prior to the field oxidation stage, wherein the second oxidation stage simultaneously oxidizes the substrate and drives the implanted dopant into the substrate. Preferably, the formation of the barrier oxide layer is conducted in a dry oxygen environment. This embodiment, as in the previous embodiments, can be employed to form a plurality of field oxide regions including and a plurality of field effect transistors isolated by the field oxide regions.

The present invention involves the high temperature formation of field oxide regions employing HCl to provide sufficient chlorine to reduce stacking faults. In accordance with the present invention, the amount of HCl is controlled to prevent reduction in the adhesion of barrier oxide layer to the semiconductor substrate thereby avoiding the generation of tip defects in narrow source/drain regions and further controlled to prevent deterioration of the barrier oxide layer upon subsequent thermal processing. The present invention involves controlling the amount of HCl employed during the formation of field oxide regions in order to achieve the same objectives disclosed in the '381 Patent, but avoids the detrimental effects of chlorine on the barrier oxide layer and at the interface between the barrier oxide layer and the semiconductor substrate which results in the formation of tip defects, particularly when forming very narrow source/drain regions, e.g., less than 0.6 µm. The amount of HCl can be optimized in a particular situation given the stated objectives, preferably employing SIMS. The present invention can be employed in the production of various types of semiconductor devices such as an MOS field effect transistor, or bipolar devices. Conventional semiconductor processing and materials can be employed to complete the formation of semiconductor devices.

Only the preferred embodiment of the invention and an example of its versatility are shown and described in the present invention. It is to be understood that the invention is capable of use in various other combinations and environments and is capable of changes or modifications within the scope of the inventive concept as expressed herein.

We claim:

1. A method of forming a field oxide region in a semiconductor substrate, which method comprises:

forming a barrier oxide layer on the substrate;

oxidizing the substrate in a dry oxygen atmosphere containing HCl at a temperature greater than about 1,050° C. in a first high temperature oxidation stage; and subsequently oxidizing the substrate in a dry oxygen atmosphere in the substantial absence of HCl at a temperature greater than about 1,050° C. in a second high temperature oxidation stage to complete the field oxide region.

2. The method according to claim 1, comprising forming a plurality of field oxide regions.

3. The method according to claim 1, wherein the second high temperature oxidation stage is conducted in the complete absence of HCl.

4. The method according to claim 1, wherein the first high temperature oxidation stage is conducted until the thickness of the field oxide region is not greater than about 75% of the final thickness thereof.

5. The method according to claim 4, wherein the first high temperature oxidation stage is conducted until the thickness of the field oxide film is not greater than about 50% of the final thickness thereof.

6. The method according to claim 5, wherein the first high temperature oxidation stage is conducted until the thickness of the field oxide film is not greater than about 25% of the final thickness thereof.

7. The method according to claim 1, wherein the amount of HCl in the first high temperature oxidation stage atmosphere is sufficient to prevent stacking faults and controlled to prevent a substantial reduction in the adhesion of the barrier oxide layer to the semiconductor substrate.

8. The method according to claim 7, wherein the amount of HCl is controlled to limit the peak concentration of chlorine at the interface between the barrier oxide layer and the silicon substrate to no greater than $1 \times 10^{19}$ atoms/cm$^3$, at the completion of the field oxide region.

9. The method according to claim 7, wherein the amount of HCl is controlled to limit the peak concentration of chlorine at the interface between the barrier oxide layer and silicon substrate to no greater than the oxygen concentration at that interface.

10. The method according to claim 8, wherein the amount of HCl is controlled to maintain the peak concentration of chlorine at the interface of the barrier oxide layer and the semiconductor substrate at no less than about $10^{16}$ atoms/cm$^3$, at the completion of the field oxide region.

11. The method according to claim 9, wherein the amount of HCl is controlled to maintain the peak concentration of chlorine at the interface of the barrier oxide layer and the semiconductor substrate at no less than about $10^{16}$ atoms/cm$^3$, at the completion of the field oxide region.

12. The method according to claim 7, wherein the amount of HCl is further controlled to prevent reduction in the time to breakdown of a gate oxide layer comprising part of the barrier oxide layer.

13. The method according to claim 12, wherein the amount of HCl is controlled to prevent deterioration of the gate oxide layer upon thermal treatment during manufacturing phases subsequent to the second high temperature oxidation stage.

14. The method according to claim 1, wherein the temperature employed during the first and second high temperature oxidation stages is no less than about 1,100° C.

15. The method according to claim 14, wherein the temperature employed during the first and second high temperature oxidation stages is about 1,100° C. to about 1,250° C.

16. The method according to claim 1, wherein the substrate comprises silicon and the field oxide region comprises silicon dioxide.

17. The method according to claim 1, further comprising oxidizing the substrate in dry oxygen at a temperature less than about 1,050° C. prior to the first high temperature oxidation stage.

18. The method according to claim 17, further wherein the substrate is oxidized at a temperature below about 1,050° C., in a dry oxygen atmosphere containing HCl, prior to the first high temperature oxidation stage.

19. The method according to claim 17, wherein the substrate contains a dopant, said method further comprising implanting a dopant having a conductivity type opposite to the conductivity type of the substrate in a portion of the substrate, prior to oxidizing at a temperature less than about 1,050° C., wherein subsequent oxidations at temperatures below and above about 1,050° C. simultaneously oxidize the substrate and drive the implanted dopant into the substrate.

20. The method according to claim 1, further comprising performing a field implant after the second high temperature oxidation stage.

21. The method according to claim 1, further comprising forming a nitride layer on the barrier oxide layer prior to oxidizing the substrate in the first high temperature oxidation stage.

22. The method according to claim 1, comprising fabricating a plurality of field effect transistors isolated by a plurality of field oxide regions.

23. The method according to claim 22, wherein the amount of HCl during the first high temperature oxidation stage atmosphere is controlled to prevent deterioration of the gate oxide layer upon thermal treatment during manufacturing phases subsequent to the second high temperature oxidation stage.

24. The method according to claim 1, further comprising providing a non-oxidizable masking layer overlying portions of the barrier oxide layer corresponding to active regions, prior to the first high temperature oxidation stage.

25. The method according to claim 24, wherein the non-oxidizable masking layer comprises silicon nitride.

26. A method of forming a field oxide region in a semiconductor substrate, which method comprises:

providing a barrier oxide layer on the substrate;

oxidizing the substrate in a dry oxygen atmosphere containing HCl at a temperature less than about 1,050° C. in a first oxidation stage; and oxidizing the substrate in a dry oxygen atmosphere in the substantial absence of HCl at a temperature greater than about 1,050° C. in a second oxidation stage.

27. The method according to claim 26, wherein the amount of HCl in the first oxidation stage atmosphere is not less than about 0.1% by volume.

28. The method according to claim 26, wherein the amount of HCl in the first oxidation stage atmosphere is sufficient to prevent stacking faults and controlled to prevent a substantial reduction in the adhesion of the barrier oxide layer to the semiconductor substrate.

29. The method according to claim 28, wherein the amount of HCl in the first oxidation stage atmosphere is controlled to limit the peak concentration of chlorine at the interface between the barrier oxide layer and the silicon substrate to no greater than about $1 \times 10^{19}$ atoms/cm$^3$, at the completion of the field oxide region.

30. The method according to claim 29, wherein the amount of HCl is controlled to maintain the peak concentration of chlorine at the interface between the barrier oxide layer and silicon substrate at no less than about $1 \times 10^{16}$ atoms/cm$^3$, at the completion of the field oxide region.

31. The method according to claim 26, wherein the amount of HCl in the first oxidation stage atmosphere is controlled to limit the peak concentration of chlorine at the interface between the barrier oxide layer and the silicon substrate to no greater than the oxygen concentration at that interface.

32. The method according to claim 31, wherein the amount of HCl is controlled to maintain the peak concentration of chlorine at the interface between the barrier oxide layer and the silicon substrate at no less than $1 \times 10^{16}$ atoms/cm$^3$, at the completion of the field oxide region.

33. The method according to claim 32, wherein the second oxidation stage is conducted in the complete absence of HCl.

34. The method according to claim 26, wherein the second oxidation stage is conducted at a temperature no less than about 1,100° C.

35. The method according to claim 34, wherein the second oxidation stage is conducted at a temperature of about 1,100° to about 1,250° C.

36. The method according to claim 26, comprising forming a non-oxidizable masking layer over portions of the barrier oxide layer corresponding to active regions.

37. The method according to claim 36, wherein the non-oxidizable masking layer comprises silicon nitride.

38. The method according to claim 26, further comprising implanting a dopant having a conductivity type opposite to the conductivity type of the substrate in a portion of the substrate, prior to the first oxidation stage, wherein the subsequent first and second oxidation stages simultaneously oxidize the silicon substrate and drive the implanted dopant into the substrate.

39. The method according to claim 26, comprising fabricating a plurality of field effect transistors in the semiconductor substrate isolated by a plurality of field oxide regions.

40. A method of forming a field oxide region in a semiconductor substrate, which method comprises:

forming a barrier oxide layer on the substrate in an atmosphere containing HCl at a temperature less than about 1,050° C.; and oxidizing the substrate in contact with the barrier oxide layer in a dry oxygen environment at a temperature in excess of about 1,050° C. in a field oxidation stage to form the field oxide region.

41. The method according to claim 40, wherein the field oxidation stage is conducted in the substantial absence of HCl.

42. The method according to claim 41, wherein the field oxidation stage is conducted in the complete absence of HCl.

43. The method according to claim 40, wherein the field oxidation stage is conducted at a temperature no less than 1,100° C.

44. The method according to claim 43, wherein the field oxidation stage is conducted at a temperature of about 1,100° C. to about 1,250° C.

45. The method according to claim 40, further comprising forming a non-oxidizable masking layer overlying portions of the barrier oxide layer corresponding to active regions.

46. The method according to claim 45, wherein the non-oxidizable masking layer comprises silicon nitride.

47. The method according to claim 40, wherein the amount of HCl during formation of the barrier oxide layer is sufficient to prevent stacking faults and controlled to prevent a substantial reduction in the adhesion of the barrier oxide layer to the semiconductor substrate.

48. The method according to claim 47, wherein the amount of HCl is controlled to limit the peak concentration of chlorine at the interface between the barrier oxide layer and the silicon substrate to no greater than about $10^{19}$ atoms/cm$^3$, at the completion of the field oxide region.

49. The method according to claim 48, wherein the amount of HCl is controlled to maintain the peak concentration of chlorine at the interface at no less than about $10^{16}$ atoms/cm$^3$, at the completion of the field oxide region.

50. The method according to claim 47, wherein the amount of HCl is controlled to limit the peak concentration of chlorine at the interface between the barrier oxide layer and the semiconductor substrate to no greater than the amount of oxygen at that interface.

51. The method according to claim 50, wherein the amount of HCl is controlled to maintain the peak concentration of chlorine at the interface at no less than $10^{16}$ atoms/cm$^3$, at the completion of the field oxide region.

52. The method according to claim 40, further comprising forming a field implantation region after the field oxidation stage.

53. The method according to claim 40, wherein the substrate contains a dopant, said method further comprising implanting a dopant having a conductivity type opposite to the conductivity type of the substrate in a portion of the substrate, prior to the field oxidation stage, wherein the field oxidation stage simultaneously oxidizes the substrate and drives the implanted dopant into the substrate.

54. The method according to claim 53, wherein the barrier oxide layer is formed in a dry oxygen environment.

55. The method according to claim 40, comprising forming a plurality of field oxide regions.

56. The method according to claim 55, comprising fabricating a plurality of field effect transistors in the semiconductor substrate isolated by the field oxide regions.

57. The method according to claim 40, wherein the amount of HCl during formation of the barrier oxide layer is no less than about 0.1% by volume.

58. The method according to claim 57, wherein the amount of HCl during formation of the barrier oxide layer is no less than about 0.25% by volume.

59. A method of forming a field oxide region in a semiconductor substrate, which method comprises:

oxidizing the substrate in a dry oxygen atmosphere containing HCl in a first oxidation stage at a first temperature; and subsequently oxidizing the substrate in the dry oxygen atmosphere in the substantial absence of HCl in a second oxidation stage at a second temperature greater than the first temperature and greater than 1050° C.

* * * * *